US010537050B2

(12) United States Patent
Elsasser et al.

(10) Patent No.: US 10,537,050 B2
(45) Date of Patent: Jan. 14, 2020

(54) MODULE INSTALLATION ALIGNMENT DEVICE

(71) Applicant: International Business Machines Corporation, Armonk, NY (US)

(72) Inventors: Ryan N. Elsasser, Poughkeepsie, NY (US); Brian E. Hanrahan, Red Hook, NY (US); Steven J. James, Poughkeepsie, NY (US); Oswald J. Mantilla, Wappingers Falls, NY (US); Enrico A. Romano, Poughkeepsie, NY (US); Yuet-Ying Yu, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 342 days.

(21) Appl. No.: 15/170,996

(22) Filed: Jun. 2, 2016

(65) Prior Publication Data
US 2017/0354072 A1 Dec. 7, 2017

(51) Int. Cl.
H05K 13/04 (2006.01)
H01R 43/20 (2006.01)
(Continued)

(52) U.S. Cl.
CPC ....... *H05K 13/0447* (2013.01); *H01R 43/205* (2013.01); *H05K 13/0015* (2013.01);
(Continued)

(58) Field of Classification Search
CPC .... H05K 3/0015; H05K 3/0023; H05K 3/046; H05K 3/0447; H05K 7/1007; H05K 13/0015; H05K 13/0053; H05K 13/046; H05K 13/0447; H01R 43/205; Y10T 29/53209; Y10T 29/53217; Y10T 29/53222; Y10T 29/53243; Y10T 29/53252; Y10T 29/53257
See application file for complete search history.

(56) References Cited

U.S. PATENT DOCUMENTS 5,413,489 A 5/1995 Switky
5,446,960 A 9/1995 Isaacs et al.
(Continued)

FOREIGN PATENT DOCUMENTS

JP 2006005345 A * 1/2006

OTHER PUBLICATIONS

List of IBM Patents or Patent Applications Treated as Related; (Appendix P), Filed Jul. 24, 2018; 2 pages.
(Continued)

*Primary Examiner* — A. Dexter Tugbang
(74) *Attorney, Agent, or Firm* — Cantor Colburn LLP; Tihon Poltavets

(57) ABSTRACT

A module installation assembly for installing a module into a socket of a land grid array includes a tool having a mounting bracket for connecting the tool to an adjacent fixture, an alignment member connected to the mounting bracket, and cavity defined at least partially by the alignment member. The cavity is substantially aligned with a socket of the land grid array such that the module is configured to pass through the cavity when being connected to the socket.

12 Claims, 7 Drawing Sheets

(51) Int. Cl.
*H05K 13/00* (2006.01)
*H05K 7/10* (2006.01)

(52) U.S. Cl.
CPC ....... *H05K 13/0053* (2013.01); *H05K 13/046* (2013.01); *H05K 7/1007* (2013.01); *Y10T 29/53209* (2015.01); *Y10T 29/53217* (2015.01); *Y10T 29/53222* (2015.01); *Y10T 29/53243* (2015.01); *Y10T 29/53252* (2015.01); *Y10T 29/53257* (2015.01)

(56) References Cited

U.S. PATENT DOCUMENTS

| | | | | |
|---|---|---|---|---|
| 6,115,909 | A * | 9/2000 | Miller | H05K 13/0447 29/739 |
| 6,711,810 | B2 | 3/2004 | Buley et al. | |
| 2011/0265317 | A1* | 11/2011 | Lin | Y10T 29/53257 29/729 |
| 2011/0287639 | A1* | 11/2011 | Hsu | H05K 7/1007 439/68 |
| 2014/0082915 | A1 | 3/2014 | Aoki et al. | |
| 2015/0118894 | A1 | 4/2015 | Huang et al. | |

OTHER PUBLICATIONS

Ryan N. Elsasser et al., "Module Installation Alignment Device", U.S. Appl. No. 16/041,173, filed Jul. 20, 2018.

\* cited by examiner

MODULE INSTALLATION ALIGNMENT DEVICE

BACKGROUND

The present invention generally relates to land grid arrays, and more particularly to the installation of modules within the sockets of a land grid array.

Area array socket connectors are an evolving technology in which an electrical interconnection between mating surface is provided through a conductive interposer. One significant application of this technology is the socketing of land grid array (LGA) modules directly to a printed wiring board in which the electrical connection is achieved by aligning the contact array of the two mating surfaces and the interpose, and then mechanically compressing the interposer. LGA socket assemblies are commonly used today in the electronics industry to attach single-chip modules or multi-chip modules to printed wiring boards.

The surface of the module that connects to the printed wiring board includes thousands of contact landing pads that attach to the circuits within the module. The electrical contactors of the module need to be aligned with corresponding electrical connection points on the printed wiring board to yield desired operation of the circuits. Successful installation of these modules without damage to the fragile contacts typically requires a skilled operator using a hand tool to keep the module level and aligned during the installation operation.

SUMMARY

In one aspect, the present invention provides a module installation assembly for installing a module into a socket of a land grid array includes a tool having a mounting bracket for connecting the tool to an adjacent fixture, an alignment member connected to the mounting bracket, and cavity defined at least partially by the alignment member. The cavity is substantially aligned with a socket of the land grid array such that the module is configured to pass through the cavity when being connected to the socket.

In one aspect, an embodiment of the present invention provides a method of mounting a module to a land grid array includes installing a tool to a fixture. The tool includes at least one alignment member and at least one cavity partially defined by the at least one alignment member. The at least one cavity of the tool is aligned with one or more corresponding sockets of the land grid array. A module is installed through the cavity such that the module is substantially aligned with the socket as it is connected to the land grid array.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings.

DETAILED DESCRIPTION

Citation of "a specific embodiment" or a similar expression in the specification means that specific features, structures, or characteristics described in the specific embodiments are included in at least one specific embodiment of the present invention. Hence, the wording "in a specific embodiment" or a similar expression in this specification does not necessarily refer to the same specific embodiment.

Hereinafter, the present invention and various embodiments of the present invention will be described in more detail with reference to the accompanying drawings. Nevertheless, it should be understood that the present invention could be modified by those skilled in the art in accordance with the following description to achieve the excellent results of the present invention. Therefore, the following description shall be considered as a pervasive and explanatory disclosure related to the present invention for those skilled in the art, not intended to limit the claims of the present invention.

Citation of "an embodiment", "a certain embodiment" or a similar expression in the specification means that related features, structures, or characteristics described in the embodiment are included in at least one embodiment of the present invention. Hence, the wording "in a embodiment", "in a certain embodiment" or a similar expression in this specification does not necessarily refer to the same specific embodiment.

Figure 1:
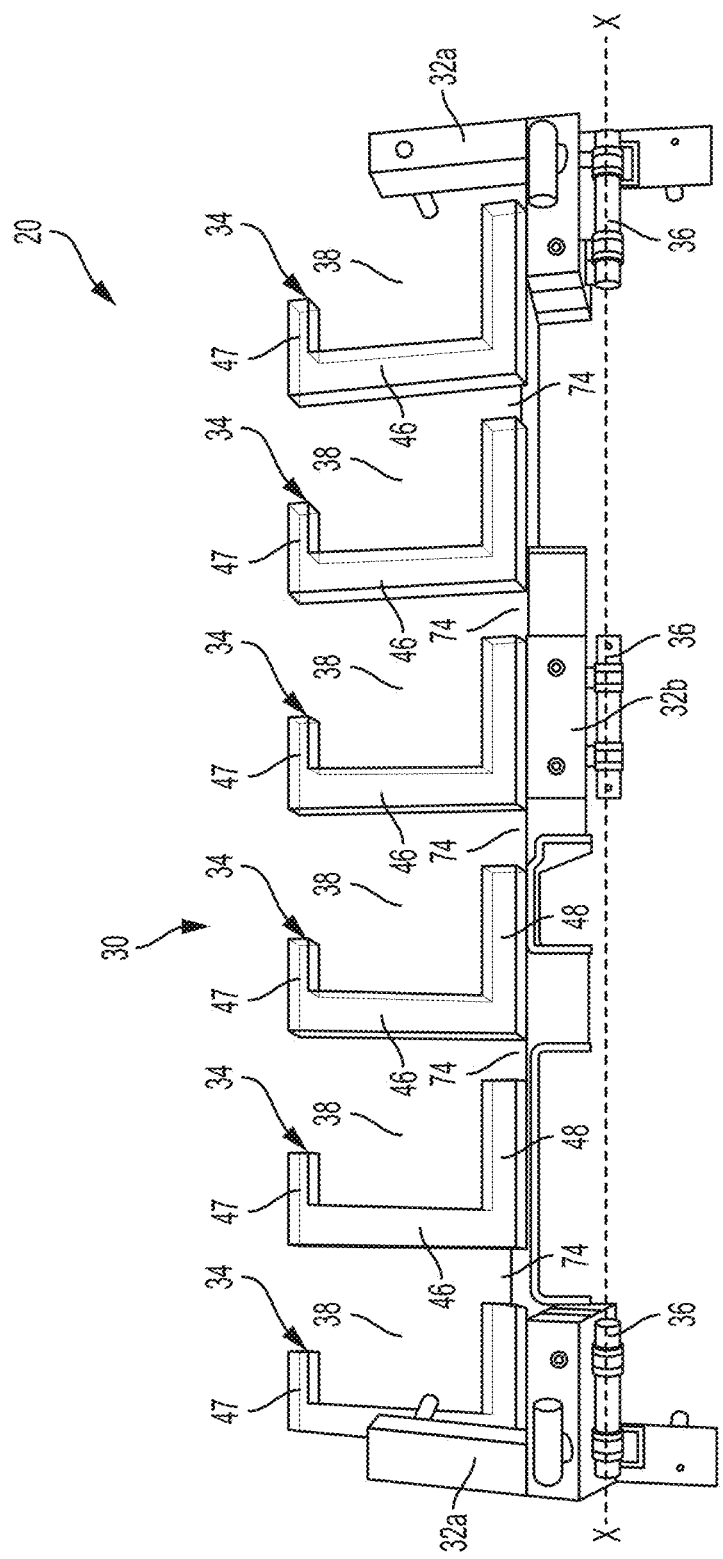
FIG. 1 is a top perspective view of a tool of a module alignment assembly used during installation of one or more modules according to an embodiment.

Referring now to FIG. 1, a module alignment assembly 20 configured to aid an operator during installation of one or more modules is shown. The module alignment assembly 20 includes a first tool 30 having a mounting bracket 32 and one or more alignment members 34 supported by the mounting bracket 32. In the illustrated, non-limiting embodiment, the tool 30 includes two end mounting brackets 32a, a central mounting bracket 32b, and six alignment members 34; however it should be understood that a tool 30 having any number of alignment members 34 and mounting brackets 32 is within the scope of the disclosure. The total number of alignment members 34 included may, but need not, correspond to the total number of modules to be installed on a component, or at a portion of a component.

In an embodiment, at least one of the mounting brackets 32 includes a pin 36 configured to define an axis X about which the tool 30 can rotate relative to an adjacent component. However, it should be understood that embodiments where each of the alignment members 34 is configured to rotate individually are also within the scope of the disclosure.

The first tool 30 is configured such that each of the plurality of alignment members 34 is positioned adjacent a corresponding socket 42 of a land grid array 40. Although the plurality of alignment members 34 are illustrated in the FIGS. as being arranged in a linear configuration, other configurations of the alignment members 34, such as where the alignment members extend in two directions, such as along both an X and a Y axis for example, are also contemplated. In addition, the plurality of alignment members 34 may be substantially identical, or alternatively, may vary based on the type of module associated with each alignment member 34.

Each alignment member 34 of the first tool 30 is configured to define a corresponding cavity 38 through which a module is passed when being mounted to a land grid array 40. Each cavity 38 is aligned with a corresponding socket 42, and is generally complementary in size and shape to a corresponding module, or alternatively, to a hand tool 44 for handling the module (see FIG. 7). In an embodiment, each cavity 38 is slightly larger in size than the hand tool 44 to provide the minimal clearance necessary to allow the hand tool 44 containing the module to pass through the cavity 38 towards the land grid array 40.

With respect to the first tool 30, each cavity 38 is defined between an alignment member 34 and at least one adjacent component of the tool 30. In embodiments where the tool 30 includes a plurality of alignment members 34, the adjacent component may be selected from another alignment member 34 and a portion of the mounting bracket 32 arranged at an end of the tool 30.

Figure 2:
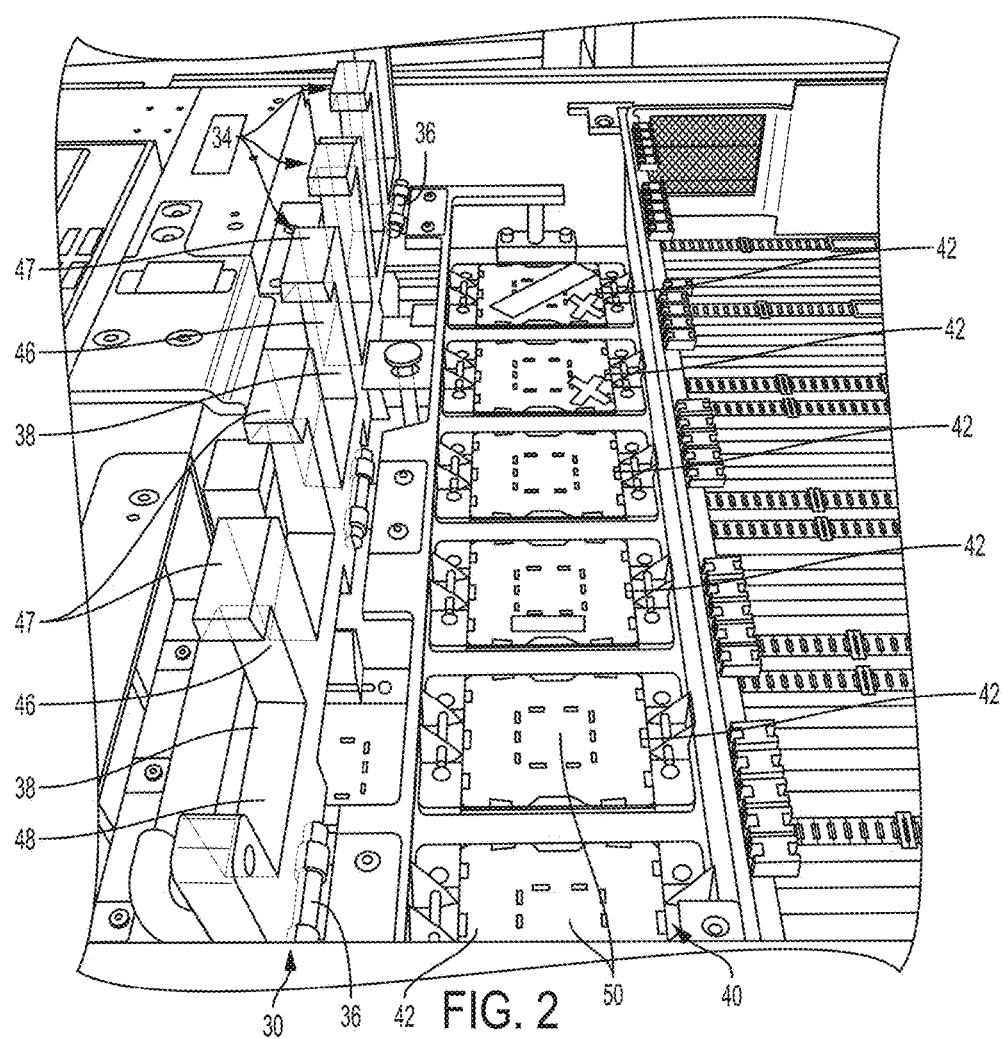
FIG. 2 is a side perspective view of the tool of FIG. 1 in an inactive position according to an embodiment.
Figure 3:
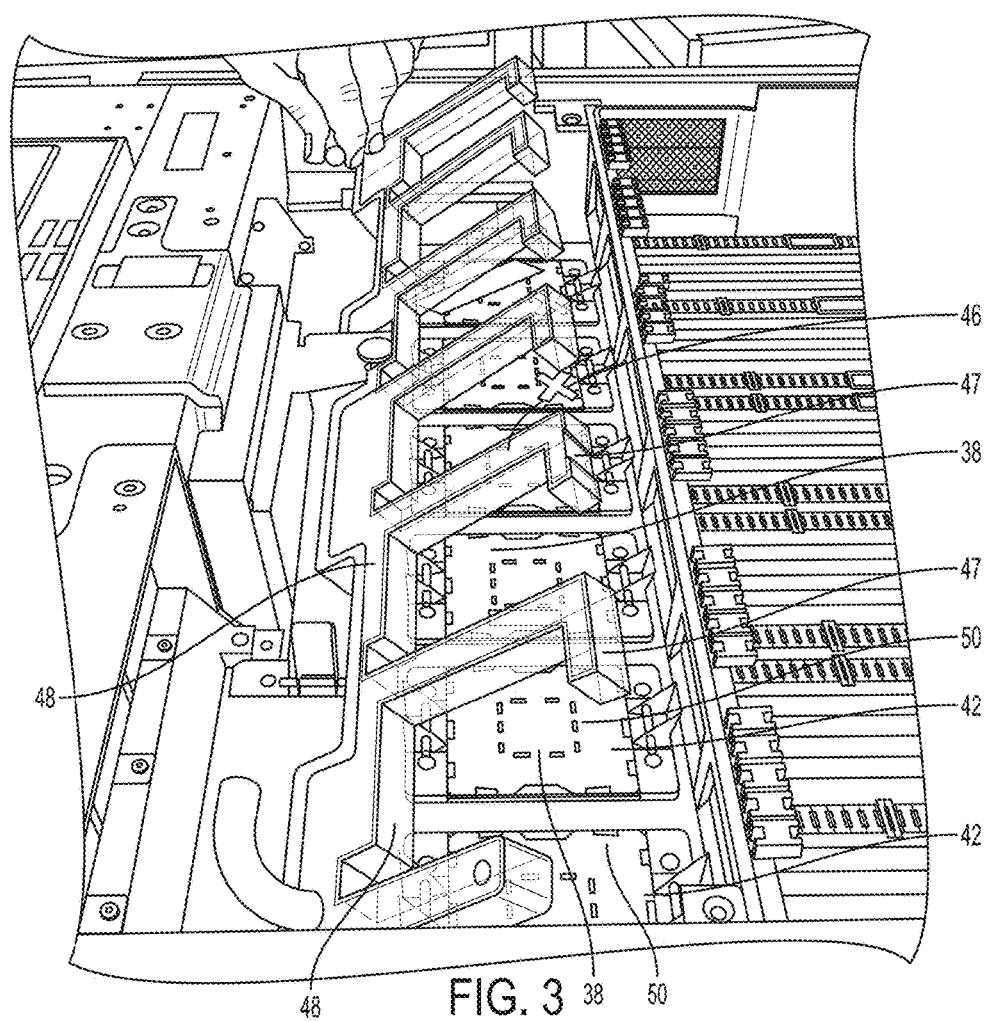
FIG. 3 is a side perspective view of the tool of FIG. 1 in an active position according to an embodiment.

In the illustrated, non-limiting embodiment, the alignment members 34 include a cross member 46 and a first and second end member 47, 48 arranged at opposite ends of the cross member 46. The cross member 46 extends in a first direction and the first and second end members 47, 48 extend in the same second direction, at an angle to the cross member 46. The first end member 47 and the second end member 48 may extend the same distance or a different distance in the second direction from the cross member 46. In embodiments where the first and second end members 47, 48 extend generally perpendicular to the cross-member 46, as shown in FIGS. 1-3, the alignment member 34 has a generally C-shaped configuration such that a portion of the cavity 38 is defined between the first and second end members 47, 48 and the cross member 46. The plurality of alignment members 34 may be integrally formed, such as at one of the end members for example, or may be separately attached to the one or more mounting brackets 32.

To use the tool 30 as shown in FIGS. 1-3, the tool 30 is connected to an adjacent component of a fixture so that the cavity 38 associated with each alignment member 34 is substantially aligned with a corresponding socket 42 of a land grid array 40. As shown in FIGS. 2 and 3, each of the sockets 42 has a cover 50 attached thereto to prevent damage to the pins of the land grid array 40 and to prevent debris from collecting between the pins. Prior to installing a module, an operator will rotate the tool 30 about the rotational axis X of the mounting brackets 32 from an active position parallel to the land grid array 40, to an inactive position (as shown in FIG. 2) arranged at an angle to the land grid array 40. The tool 30 or the component to which the tool 30 is rotatably mounted may, but need not include a mechanism, such as a latch or a magnet for example, for retaining the tool 30 in the inactive position.

Figure 7:
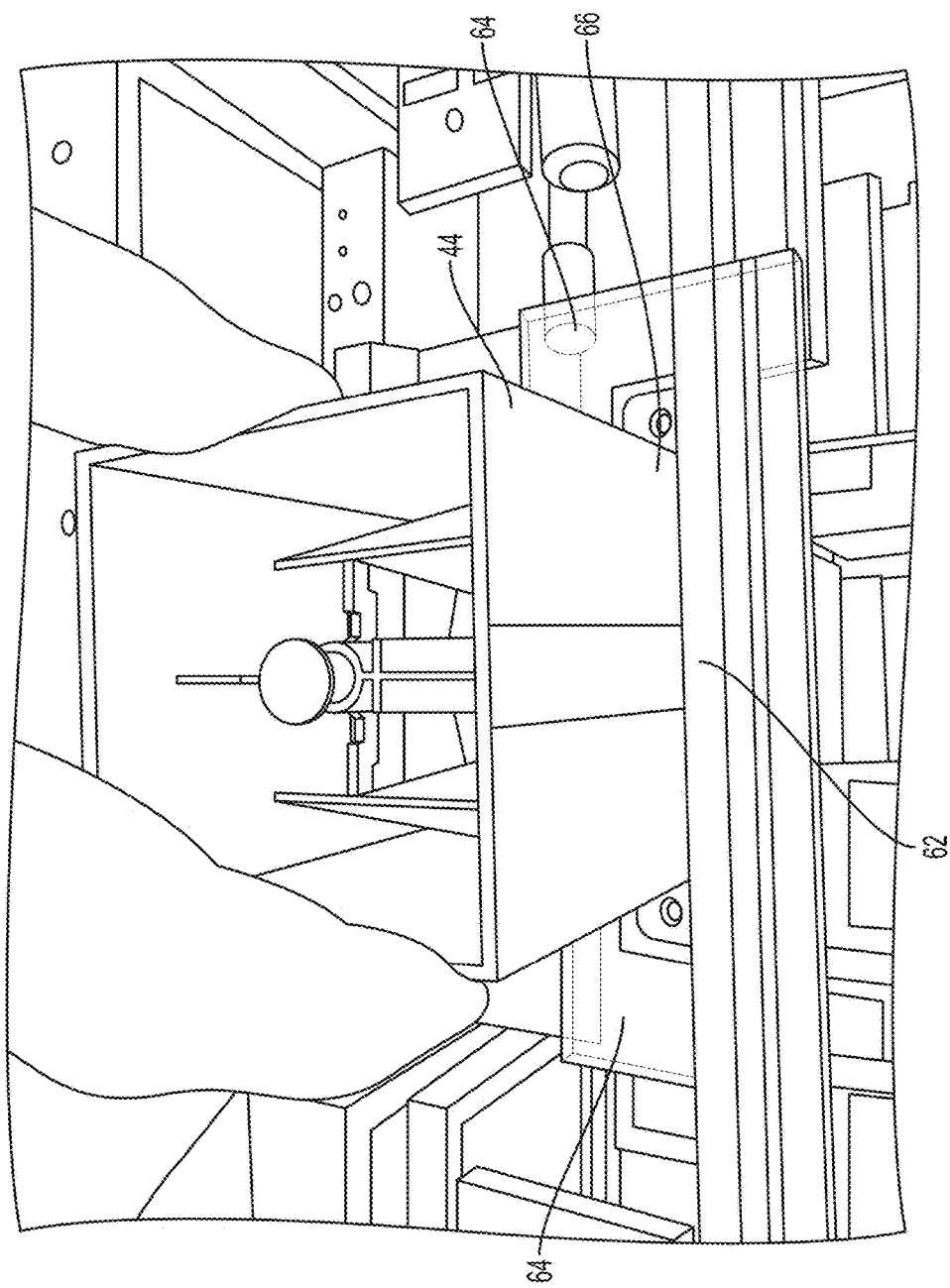
FIG. 7 is a perspective view of a hand tool positioned within a cavity defined by the module alignment assembly according to an embodiment.

In the embodiment illustrated in FIG. 2, when in the inactive position, the tool 30 is arranged generally vertically such that the tool 30 does not interfere with an operator's access to the sockets 42 of the land grid array 40. When the tool 30 is in the inactive position, the operator may easily prepare a socket 42 for receiving a module by removing the cover 50 therefrom to expose the pins. An operator then rotates the tool 30 in an opposite direction about rotational axis X to return the tool 30 to the active position. In the active position, an operator may insert a hand tool 44 containing a module, as shown in FIG. 7, through a cavity associated with the socket 42 where the cover 50 was removed. Due to the limited clearance between the hand tool 44 and the cavity 38, the hand tool 44, and therefore, the module is aligned with the socket 42 within an acceptable tolerance, as the module is installed therein.

Figure 4:
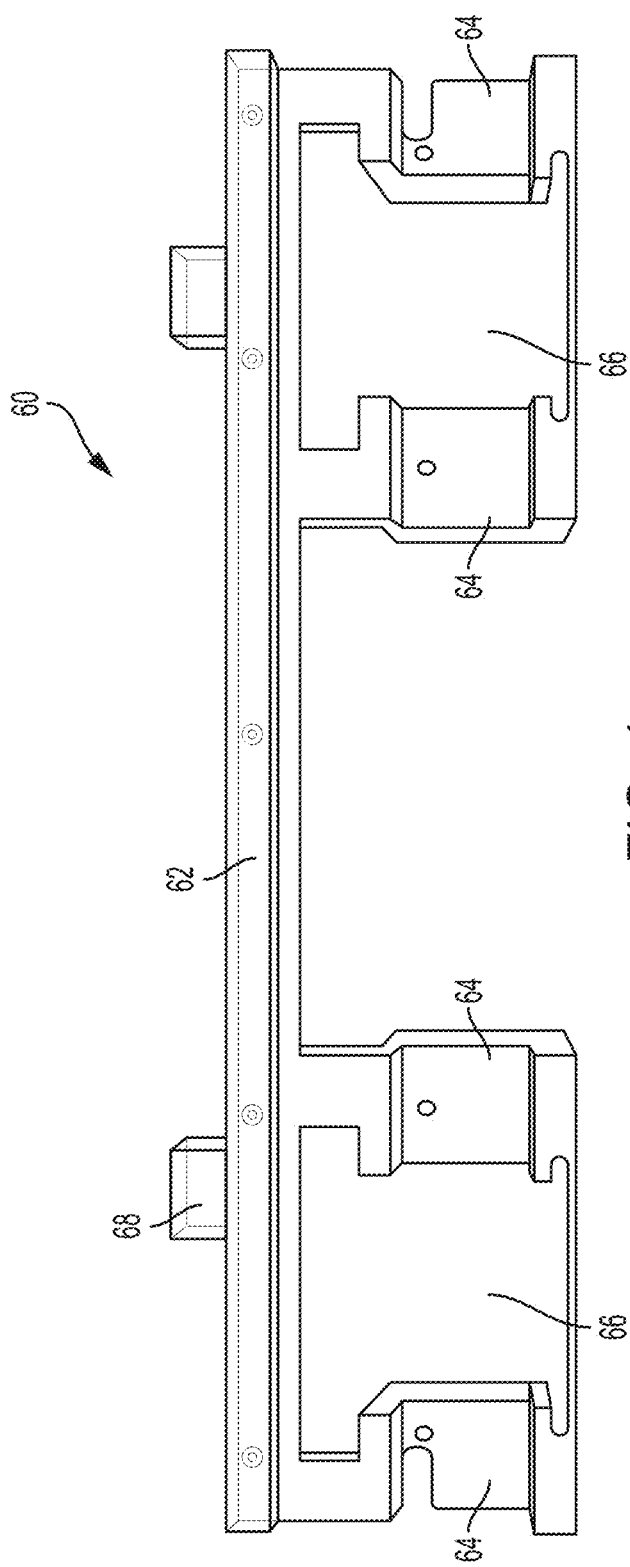
FIG. 4 is a top perspective view of another tool of a module alignment assembly used during installation of one or more modules according to an embodiment.

With reference now to FIGS. 4-7, the module alignment assembly 20 may include a second tool 60 in addition to, or in place of the first tool 30 for aiding in the installation of modules on a land grid array 40. As shown in FIG. 4, the second tool 60 includes a base 62 and a plurality of second alignment members 64 extending from the base 62. As shown, the base 62 and the plurality of second alignment members 64 are integrally formed; however embodiments, where the plurality of second alignment members 64 connect to the base 62, are also contemplated. In the illustrated, non-limiting embodiment, the second alignment members 64 are arranged in pairs and the tool 60 includes a plurality of pairs, for example, two pairs of second alignment members 64. Each of the pairs of second alignment members 64 may be substantially identical, or alternatively, may vary based on the type of module associated with each pair. As shown, the plurality of pairs extends from the base 62 in the same direction; however the second alignment members 64 may be arranged in other configurations.

Each pair of second alignment members 64 is configured to define a corresponding cavity 66 there between through which a module to be mounted is passed when being connected to a socket 42. Each cavity 66 is generally complementary in size and shape to a corresponding module, or alternatively, to a hand tool 44 for handling the module. In an embodiment, each cavity 66 defined by the second alignment members 64 is slightly larger in size than the hand tool 44 to provide the minimal clearance necessary to allow the tool 44 holding the module to pass through the cavity 66 towards the socket 42. The second tool 60 may be configured to connect to an adjacent component of a fixture so that the cavity 66 associated with each pair of second alignment members 64 is substantially aligned with a corresponding socket 42 of a land grid array 40.

Figure 5:
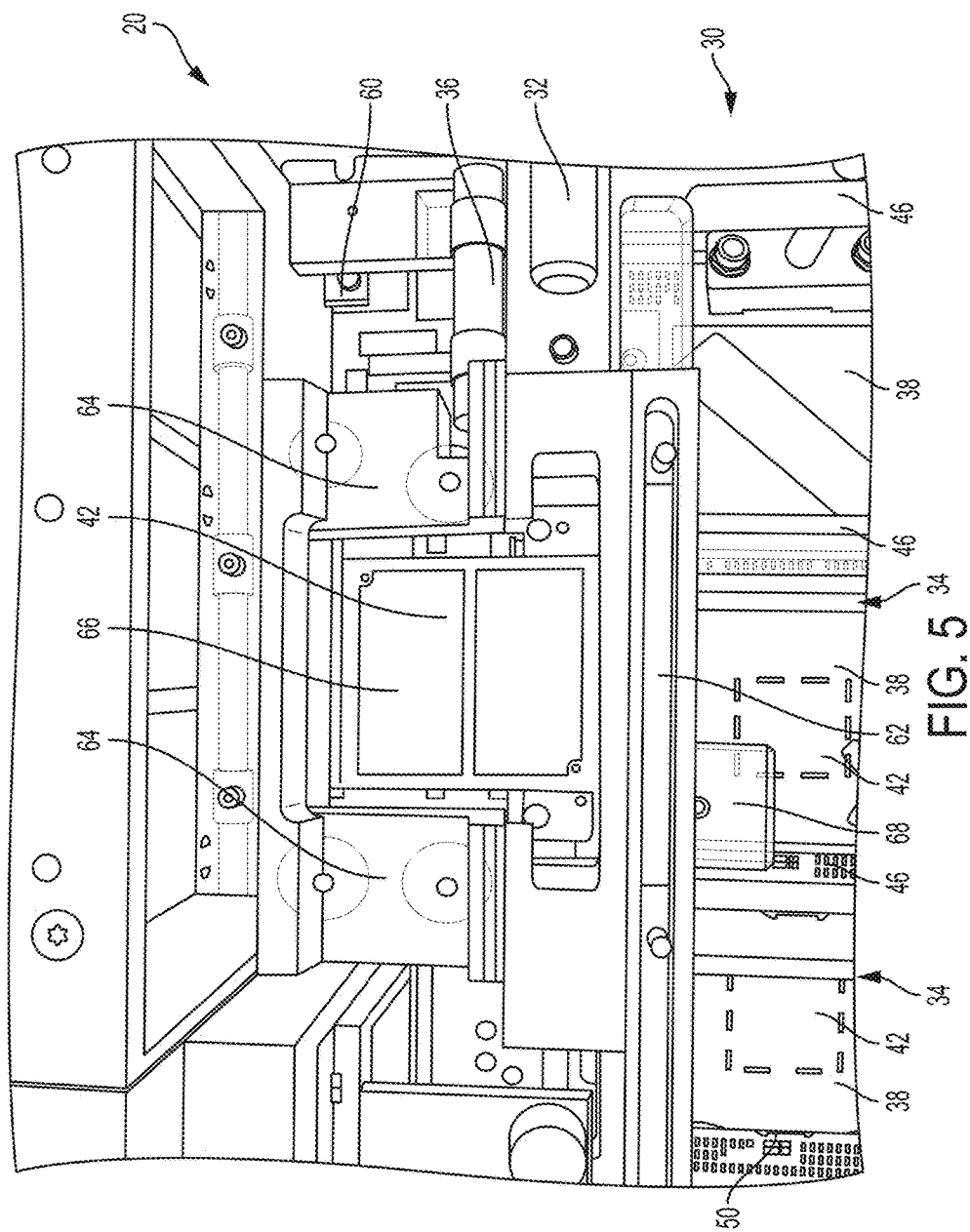
FIG. 5 is a top perspective view of the module alignment assembly according to an embodiment.

In the illustrated, non-limiting embodiment shown in FIG. 5, the second tool 60 is configured to removably couple directly to the first tool 30. When the second tool 60 is coupled to the first tool 30, the first tool is unable to rotate about its axis X. In the embodiment illustrated, when the first and second tools 30, 60 are connected, the base 62 of the second tool 60 is in overlapping arrangement with the second end member 48 of the first alignment members 34. As a result, the plurality of first alignment members 34 extends in a first direction, and the plurality of second alignment members 64 extends in a second opposite direction.

Figure 6:
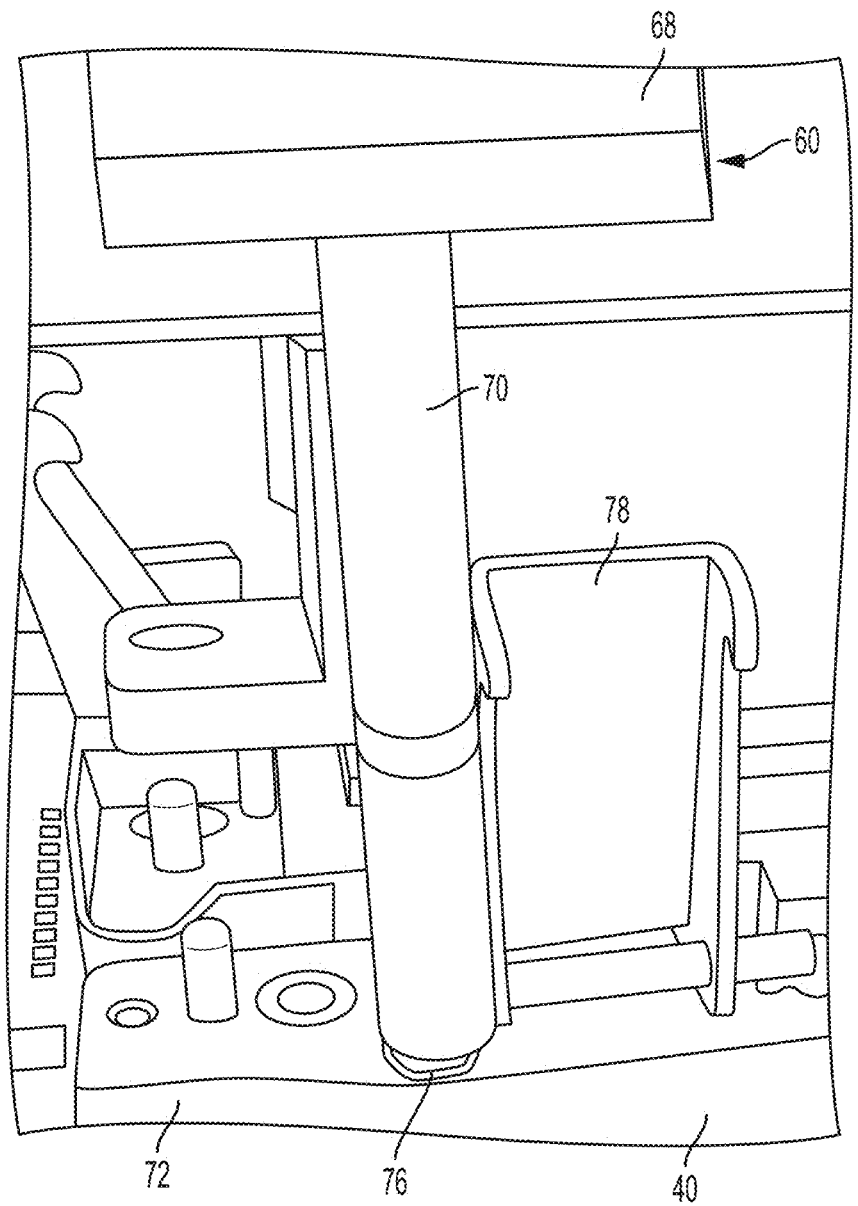
FIG. 6 is a view of the coupled first and second tools of the module alignment assembly according to an embodiment.

With reference to FIGS. 4-6, a connection tab 68 extends outwardly from the base 62 in a direction opposite the second alignment members 64. A pin or dowel 70 mounted to the connection tab 68 extends at an angle thereto. As shown, for example, in FIG. 6, in an embodiment, the pin 70 extends perpendicular to the connection tab 68, such that the pin 70 is arranged generally vertically and is supported on a surface 72 adjacent the land grid array 40. In an embodiment, when the first and second tool are coupled, the pin 70 is received within an opening 74 (FIG. 1) formed between the second end member 48 of a first alignment member 34 and the cross-member 46 of an adjacent first alignment member 34. Referring again to FIG. 5, when the first and second tools 30, 60 are coupled, the pin 70 is received about a spring 76. The pin 70 is configured to compress the spring 76 a necessary amount to move a component 78 adjacent to and associated with the spring 76 to a position that does not interfere with an operator's access to the sockets 42.

When the module installation assembly 20 includes the first tool 30 and the second tool 60, the first tool 30 may be configured for the installation of central processor (CP) modules, and the second tool 60 may be configured for the installation of system control (SC) modules. To use the assembly 20, the first tool 30 is connected to an adjacent component of a fixture so that the cavity 38 associated with each alignment member 34 is substantially aligned with a corresponding socket 42 of a land grid array 40. Prior to connecting the second tool 60 to the first tool 30, the covers 50 are removed from the one or more sockets 42 configured to receive SC modules. The second tool 60 is then connected to the first tool 30 such that the cavities 66 defined by the second alignment members 64 are in alignment with the adjacent SC sockets 42. An operator may then insert a hand tool 44 containing a module through each cavity 66. Due to the limited clearance between the hand tool 44 and the cavity 66, the hand tool 44, and therefore the module is level to and aligned with the socket 42 within an acceptable tolerance. After each module associated with the second tool 60 is installed, the second tool 60 is disconnected from the first tool 30.

The first tool 30 is then rotated about the rotational axis X of the mounting brackets 32 from an active position parallel to the land grid array 40, to an inactive position (as shown in FIG. 2) arranged at an angle to the land grid array 40, so that an operator may remove a cover 50 from one of the sockets 42 configured to receive a CP module. After removal of the cover 50, the tool 30 is returned to the active position where a hand tool 44 containing a CP module, is inserted through a cavity 38 for connection with the exposed CP socket 42. In an embodiment, a cover 50 is removed and a CP module is installed into each socket 42 sequentially. Alternatively, each of the plurality of covers 50 may be removed when the tool 30 is rotated to the inactive position, and then each of the plurality or CP modules may be installed when the tool 30 is returned to the active position.

Use of the module installation assembly 30 as described herein substantially increases the likelihood of correctly plugging modules into a land grid array.

The foregoing detailed description of the embodiments is used to further clearly describe the features and spirit of the present invention. The foregoing description for each embodiment is not intended to limit the scope of the present invention. All kinds of modifications made to the foregoing embodiments and equivalent arrangements should fall within the protected scope of the present invention. Hence, the scope of the present invention should be explained most widely according to the claims described thereafter in connection with the detailed description, and should cover all the possibly equivalent variations and equivalent arrangements.

The invention claimed is:

1. A module installation assembly for installing a module into a socket of a land grid array, the module installation assembly comprising:
   a tool including:
      a mounting bracket for connecting the tool to an adjacent fixture;
      an alignment member connected to the mounting bracket; and
      a cavity defined at least partially by the alignment member,
      the cavity being substantially aligned with the socket of the land grid array such that the module is to pass through the cavity when being connected to the socket,
      the cavity having a size and shape generally complementary to a hand tool for holding the module as the module is installed into the socket, and
      the cavity being sized to provide a minimum clearance necessary for moving the hand tool through the cavity while maintaining the hand tool in alignment with the socket.

2. The module installation assembly according to claim 1, wherein the alignment member is C-shaped.

3. The module installation assembly according to claim 1, wherein the tool includes a plurality of alignment members and a plurality of cavities, at least one of the plurality of cavities being defined between adjacent alignment members.

4. The module installation assembly according to claim 1, wherein the mounting bracket defines an axis of rotation such that the tool is rotatable between an active position and an inactive position.

5. The module installation assembly according to claim 4, wherein in the active position, the tool is generally parallel to the land grid array and in the inactive position the tool is arranged at an angle to the land grid array.

6. A module installation assembly for installing a module into a socket of a land grid array, the module installation assembly comprising:
   a tool including:
      a mounting bracket for connecting the tool to an adjacent fixture;
      an alignment member connected to the mounting bracket; and
      a cavity defined at least partially by the alignment member,
      the cavity being substantially aligned with the socket of the land grid array such that the module is to pass through the cavity when being connected to the socket,
      wherein the tool is a first tool and the module installation assembly further comprises a second tool removably coupled to the first tool and including:
         a base;
         a pair of other alignment member features; and
         another cavity defined between the pair of other alignment member features.

7. The module installation assembly according to claim 6, wherein the base of the second tool is mountable in an overlapping arrangement with a portion of the alignment member.

8. The module installation assembly according to claim 7, wherein the first tool and the second tool are coupled, the alignment member extends in a first direction and the pair of other alignment member features extends in a second direction, different from the first direction.

9. The module installation assembly according to claim 8, wherein the second direction is opposite the first direction.

10. The module installation assembly according to claim 6, wherein the base of the second tool includes a pin receivable about a spring on a surface adjacent the land grid array, the pin being configured to compress the spring to move an adjacent component out of a path of interference with the land grid array.

11. The module installation assembly according to claim 10, wherein the first tool includes a plurality of alignment members and the pin of the second tool is receivable within an opening defined between adjacent ones of the plurality of alignment members.

12. The module installation assembly according to claim 6, wherein at least one of the first tool and the second tool is used to mount a central processor module, and the other of the first tool and the second tool is used to mount a system control module.

* * * * *